United States Patent
Cho et al.

(10) Patent No.: US 7,441,937 B2
(45) Date of Patent: Oct. 28, 2008

(54) BACKLIGHT ASSEMBLY AND DISPLAY APPARATUS HAVING THE SAME

(75) Inventors: So-Haeng Cho, Seoul (KR); Jin-Wook Yang, Suwon-si (KR); Yong-Se Park, Seoul (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 98 days.

(21) Appl. No.: 11/287,634

(22) Filed: Nov. 28, 2005

(65) Prior Publication Data

US 2006/0114694 A1 Jun. 1, 2006

(30) Foreign Application Priority Data

Nov. 29, 2004 (KR) .................... 10-2004-0098582

(51) Int. Cl.
*F21V 7/04* (2006.01)
(52) U.S. Cl. .................... 362/633; 362/631; 349/58
(58) Field of Classification Search ............ 362/631, 362/632, 633, 634, 26, 29, 30, 561; 349/61–71, 349/58; 361/681
See application file for complete search history.

(56) References Cited

U.S. PATENT DOCUMENTS

| | | | | |
|---|---|---|---|---|
| 6,583,831 B2 * | 6/2003 | Kim | ............................ | 349/58 |
| 6,593,979 B1 * | 7/2003 | Ha et al. | ........................ | 349/58 |
| 6,667,780 B2 * | 12/2003 | Cho | ............................ | 349/58 |
| 6,771,332 B2 * | 8/2004 | Yamada | ........................ | 349/62 |
| 6,871,977 B2 * | 3/2005 | Osawa | ......................... | 362/602 |
| 7,001,061 B2 * | 2/2006 | Chino | .......................... | 362/633 |
| 7,052,153 B2 * | 5/2006 | Kawashima et al. | ......... | 362/631 |

* cited by examiner

*Primary Examiner*—Bao Q Truong
*Assistant Examiner*—Gunyoung T. Lee
(74) *Attorney, Agent, or Firm*—F. Chau & Associates, LLC.

(57) ABSTRACT

A backlight assembly having no step difference at a rear portion thereof includes a light generating unit and a receiving member. The light-generating unit includes a connecting member, a light source and a light guiding member. An external signal is transmitted to the light source through the connecting member, and a light is generated from the light source in response to the external signal. The light generated from the light source is guided to a display panel via the light guiding member. The receiving member includes a receiving space for receiving the light source and the light guiding member, and a receiving portion for receiving the connecting member. The receiving portion is formed on a rear surface of the receiving member. Accordingly, a thickness increase due to a step difference at the rear surface of the backlight assembly is sufficiently prevented.

19 Claims, 7 Drawing Sheets

BACKLIGHT ASSEMBLY AND DISPLAY APPARATUS HAVING THE SAME

CROSS-REFERENCE TO RELATED APPLICATION

This application claims priority to Korean Patent Application No. 2004-98582 filed on Nov. 29, 2004, the contents of which are herein incorporated by reference in its entirety.

BACKGROUND OF THE INVENTION

1. Field of the Invention

The present invention relates to a backlight assembly and a display apparatus including the backlight assembly. More particularly, the present invention relates to a backlight assembly with a lesser overall thickness than conventional backlight assemblies and a display apparatus including the same.

2. Description of the Related Art

Generally, a liquid crystal display (hereinafter, referred to as LCD) apparatus includes a backlight assembly disposed under an LCD panel for generating light and guiding the light to the LCD panel. However, conventional backlight assemblies typically contribute significantly to an increase in the weight, volume and power consumption of the LCD apparatus. The above-mentioned drawbacks of conventional backlight assemblies become even more pronounced in a portable LCD apparatus which requires a lighter weight, a smaller thickness and lower power consumption for the LCD apparatus.

In order to overcome the above drawbacks of the conventional backlight assemblies, a light emitting diode (hereinafter, referred to as LED), which is a kind of a point light source, has been utilized as part of the backlight assembly of a recent LCD apparatus.

The LED requires lower power consumption as compared to other conventional light sources and is suitable for use with a portable LCD apparatus being of lightweight and of small thickness. In particular, the irradiation distance, which is the distance between a light source and a display panel, is much shorter between an LED and a display panel than between other conventional light sources and the display panel. Therefore, the LED is much more widely utilized as a part of a backlight assembly as a light source of a backlight assembly for a small and medium sized display apparatus having a narrow display area.

However, when the LED is utilized as the light source for an LCD apparatus, various additional members, such as driving members for driving the LED and assembly members for assembling the LED to the LCD apparatus, are necessarily required as well as in addition to the LED itself. Consequently, the overall size of the LCD apparatus is increased due to the various additional members related to the LED.

SUMMARY OF THE INVENTION

Exemplary embodiments of the present invention provides a backlight assembly capable of decreasing an overall thickness of the backlight assembly.

Exemplary embodiments of the present invention provides a display apparatus having the above backlight assembly.

"In an exemplary embodiment of the invention, a backlight assembly comprises a light-generating unit and a receiving member. The light-generating unit includes a connecting member, a light source and a light guiding member. An external signal is transmitted to the light source through the connecting member, and a light is generated from the light source in response to the external signal. In addition, the light is guided to a display panel via the light guiding member. The receiving member includes a receiving space for receiving the light source and the light guiding member, and a receiving portion for receiving the connecting member. The receiving portion comprises a recessed portion recessed from a rear surface of the receiving member to a predetermined depth for receiving the connecting member. The depth of the recessed portion is substantially identical to a thickness of the connecting member."

In another exemplary embodiment of the invention, a display apparatus includes a display unit, a backlight assembly and a receiving member. The display unit includes a display panel displaying an image in response to a first driving signal and a first connecting member electrically connected to the display panel.

The backlight assembly includes a second connecting member, a light source and a light guiding member. The second connecting member is electrically connected to the first connecting member, and a second driving signal is transmitted to the second connecting member. The light source is connected to the second connecting member and generates a light in response to the second driving signal. The light is guided to the display panel via the light guiding member.

The receiving member includes a receiving space for receiving the light source and the light guiding member, and a receiving portion for receiving the connecting member. The receiving portion is formed on a rear surface of the receiving member.

According to at least one exemplary embodiment of the present invention, no step difference or at the very least substantially no step difference is formed between the connecting member and the rear surface of the receiving member. As a result, even though the connecting member is disposed on the rear surface of the receiving member, the overall thickness of the backlight assembly is not increased or at the very least not appreciably increased.

BRIEF DESCRIPTION OF THE DRAWINGS

The above and other advantages of the exemplary embodiments of the present invention will become readily apparent by reference to the following detailed description when considered in conjunction with the accompanying drawings wherein.

DESCRIPTION OF THE PREFERRED EMBODIMENTS

The exemplary embodiments of the invention are now described more fully hereinafter with reference to the accompanying drawings, in which embodiments of the invention are shown. This invention may, however, be embodied in many different forms and should not be construed as limited to the embodiments set forth herein. In the drawings, the size and relative sizes of layers and regions may be exaggerated for clarity. Like numbers refer to like elements throughout. As used herein, the term "and/or" includes any and all combinations of one or more of the associated listed items.

It will be understood that, although the terms first, second, third etc. may be used herein to describe various elements, components, regions, and/or sections, these elements, components, regions, and/or sections should not be limited by these terms. These terms are only used to distinguish one element, component, region, or section from another region, or section. Thus, a first element, component, region, layer or section discussed below could be termed a second element, component, region, or section without departing from the teachings of the present invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing, and the regions illustrated in the figures are schematic in nature and their shapes are not intended to illustrate the actual shape of a region of a device and are not intended to limit the scope of the invention.

Figure 1:
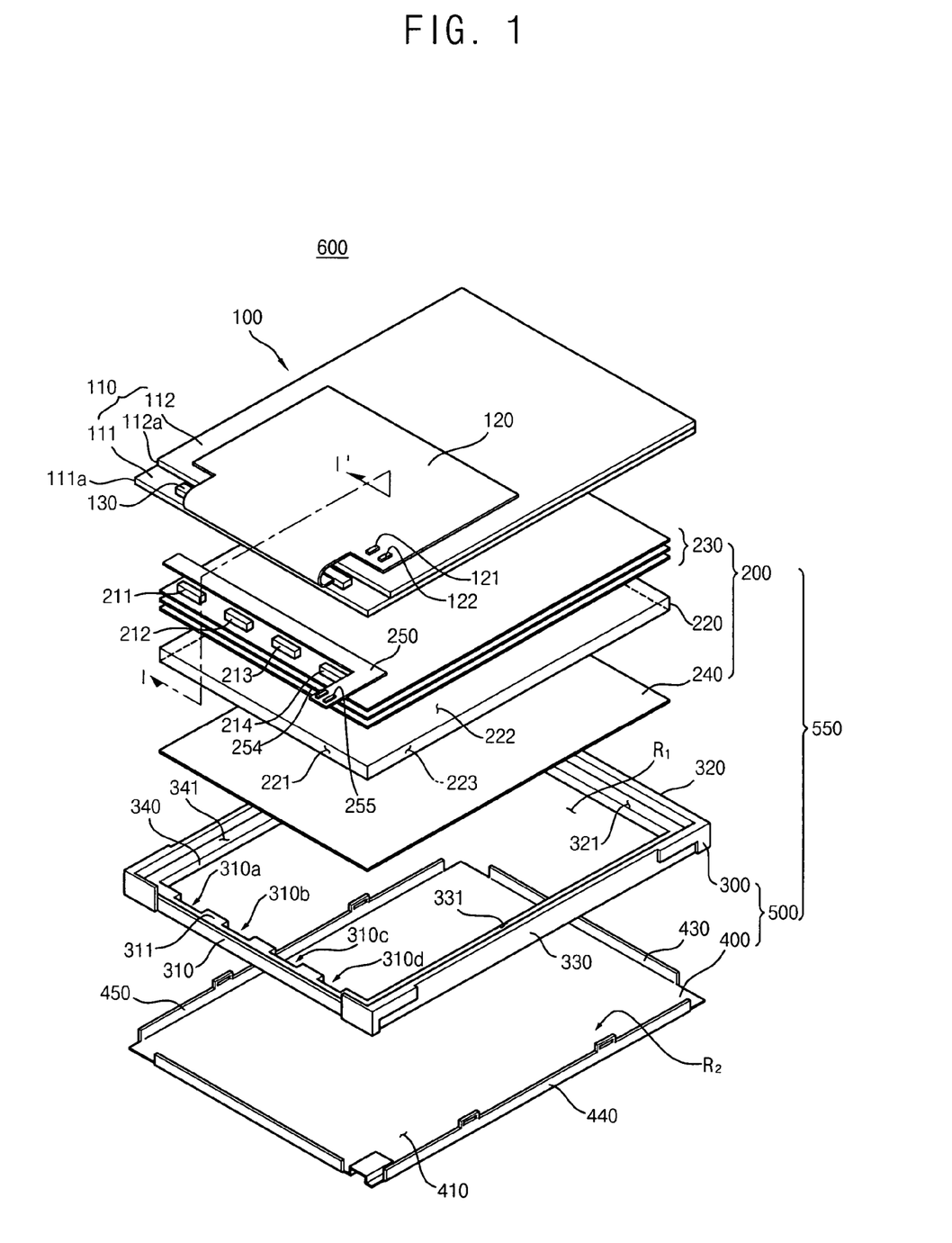
FIG. 1 is an exploded perspective view illustrating an LCD apparatus according to an exemplary embodiment of the present invention.
Figure 2:
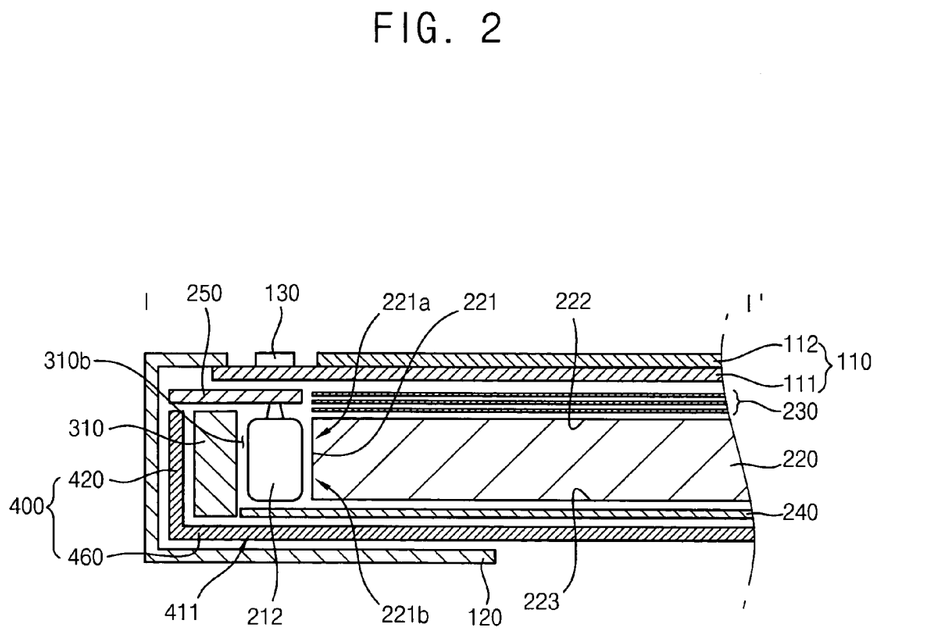
FIG. 2 is a cross-sectional view taken along a line I-I' in FIG. 1.

FIG. 1 is an exploded perspective view illustrating an LCD apparatus according to an exemplary embodiment of the present invention, and FIG. 2 is a cross-sectional view taken along a line I-I' in FIG. 1.

Referring to FIGS. 1 and 2, an LCD apparatus 600 in accordance with an exemplary embodiment of the invention includes a display unit 100 displaying an image, and a backlight assembly 550 generating a light. The backlight assembly 550 is disposed under the display unit 100 and provides the display unit 100 with the light generated from the backlight assembly 550. Moreover, the display unit 100 displays an image using the light generated from the backlight assembly 550.

The display unit 100 includes a display panel 110, a first flexible printed circuit board (hereinafter, referred to as FPC) 120 and a driver 130. The first FPC 120 is connected to the display panel 110 for receiving an external signal. The driver 130 generates a first driving signal in response to the external signal, and the display panel 110 displays an image in response to the first driving signal.

The display panel 110 includes an array substrate 111, a color filter substrate 112 facing the array substrate 111, and a liquid crystal layer (not shown) interposed between the array substrate 111 and the color filter substrate 112.

An end portion 11a of the array substrate 111 is extended from a portion corresponding to an end portion 112a of the color filter substrate 112. Therefore, the driver 130 is mounted on the end portion 111a of the array substrate 111 as a chip. The first FPC 120 is connected to the end portion 11a of the array substrate 111, and is electrically connected to the driver 130. Thus, the external signal is provided to the driver 130 through the first FPC 120.

The first FPC 120 receives a second driving signal externally to provide the backlight assembly 550 with the second driving signal.

The backlight assembly 550 includes a light-generating unit 200 generating the light, and a receiving member 500 receiving the light-generating unit 200. The light generating unit 200 includes first, second, third and fourth LEDs 211, 212, 213 and 214 and a second FPC 250.

The second driving signal outputted from the first FPC 120 is supplied to the first to fourth LEDs 211 to 214 through the second FPC 250, and the first to fourth LEDs 211 to 214 generate the light in response to the second driving signal.

In each of the first to fourth LEDs 211 to 214, minor carriers, for example, an electron or a hole, are generated based on a p-n junction structure of a semiconductor, and the light is generated when the minor carriers are recombined with each other. Although the above exemplary embodiment discloses four LEDs as a light source, the number of the LEDs used may vary, as would be readily apparent to one of the ordinary skill in the art.

Figure 3:
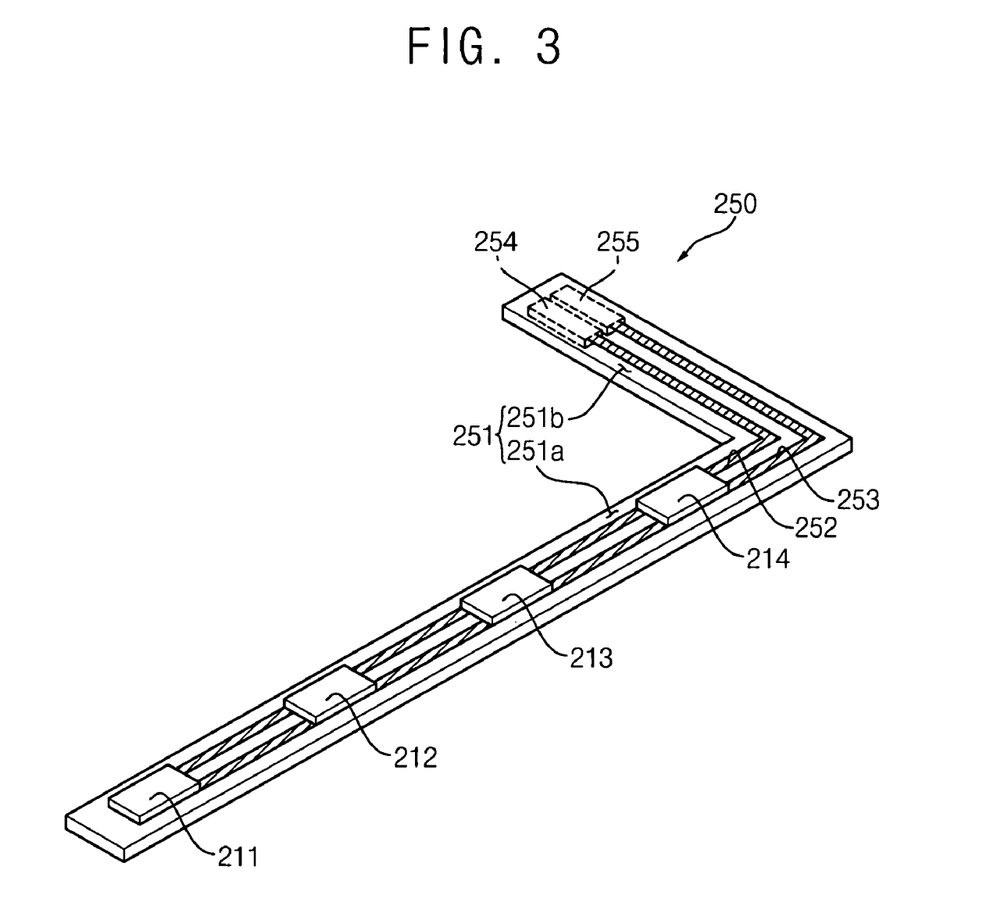
FIG. 3 is a perspective view illustrating a second flexible printed circuit board in FIG. 2.

FIG. 3 is a perspective view illustrating a second FPC shown in FIG. 1.

Referring to FIG. 3, the second FPC 250 includes a base film 251, first and second electrode lines 252 and 253, and first and second input terminals 254 and 255. The first and second electrode lines 252 and 253 are formed on the base film 251. The first and second electrode lines 252 and 253 are extended substantially in parallel with each other and insulated from each other. The first and second input terminals 254 and 255 are formed on the base film 251, and are electrically connected to the first and second electrode lines 252 and 253, respectively.

The first and second input terminals 254 and 255 are soldered to and thereby electrically connected to first and second output terminals 121 and 122 formed on the first FPC 120, respectively. Thus, the first and second input terminals 254 and 255 receive the second driving signal through the first and second output terminals 121 and 122, respectively.

The first to fourth LEDs 211 to 214 are mounted on the base film 251, and are spaced apart from each other by a predetermined interval. The base film 251 includes a mounting portion 251a and a connection portion 251b. The first to fourth LEDs 211 to 214 are mounted on the mounting portion 251a. The connecting portion 251b is bended and extended from an end portion of the mounting portion 251a.

Each of the LEDs 211 to 214 is electrically connected to the first and second electrode lines 252 and 253. Thus, the first to fourth LEDs 211 to 214 receive the second driving signal through the first and second electrode lines 252 and 253, thereby generating the light.

The first and second input terminals 254 and 255 are disposed on the connection portion 251b of the base film 251. The first and second input terminals 254 and 255 receive the second driving signal through the first and second output terminals 121 and 122 disposed on the first FPC 120, and in turn provide the second driving signal to the first and second electrode lines 252 and 253.

Referring again to FIGS. 1 and 2, the light-generating unit 200 further includes a light guiding plate 220. The light guiding plate 220 guides the light generated from the first to fourth LEDs 211 to 214 to the display panel 110. The light guiding plate 220 has a rectangular plate shape corresponding to the display panel 110, and includes a light incident face 221, a light-exiting (or light-emitting) face 222 and a specular (or light reflecting) face 223.

The light incident face 221 is disposed adjacent to the first to fourth LEDs 211 to 214, and the light generated from the first to fourth LEDs 211 to 214 enters into the light incident face 221.

The light-exiting face 222 is extended from a first end portion 221a of the light incident face 221, and the light supplied through the light incident face 221 is irradiated through the light-exiting face 222.

The specular face 223 is extended from a second end portion 221b of the light incident face 221, which is opposite to the first end portion 221a of the light incident face 221, and faces the light-exiting face 222. The specular face 223 reflects the light supplied through the light incident face 221 toward the light-exiting face 222.

In the present exemplary embodiment, the light guiding plate 220 is formed to be a plate shape as shown in FIG. 1, so that an interval between the light-exiting face 222 and the specular face 223 is not varied along the whole light guiding plate 220. However, the light guiding plate may be formed to be a wedge in which the interval between the light-exiting face 222 and the specular face 223 linearly varies along the whole light guiding plate 220, as would be readily apparent to one of the ordinary skill in the art. For example, the farther the interval is from the first to fourth LEDs 211 to 214, the smaller the interval is between the light exiting face 222 and the specular face 223 along the whole light guiding plate 220.

A plurality of optical sheets 230 are disposed over the light-exiting face 222 so as to enhance optical characteristics of the light that exits through the light-exiting face 222. The plurality of optical sheets 230 have a size corresponding to that of the light-exiting face 222.

A reflecting plate 240 may be disposed under the specular face 223, and have a size corresponding to that of the specular face 223. The reflecting plate 240 reflects a leakage light leaking from the specular face 223 toward the light guiding plate 220, thereby increasing light efficiency.

Meanwhile, the receiving member 500 includes a mold frame 300 and a bottom chassis 400.

Figure 4:
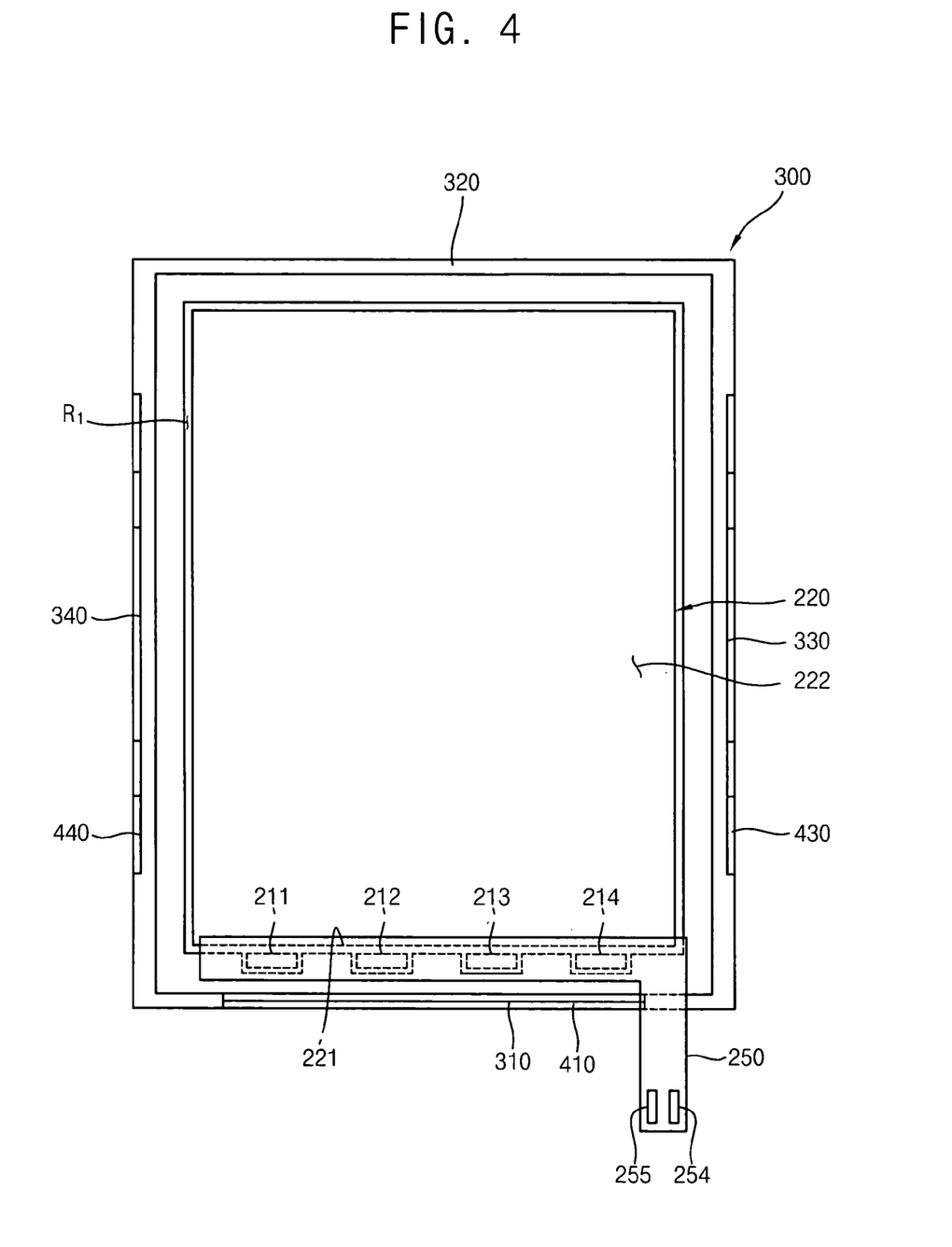
FIG. 4 is a plan view illustrating an assembled structure of a light generating unit and a receiving member in FIG. 1.

FIG. 4 is a plan view illustrating an assembled structure of a light generating unit and a receiving member shown in FIG. 1.

Referring to FIGS. 1, 2 and 4, the mold frame 300 has, for example, a rectangular frame having first, second, third and fourth sidewalls 310, 320, 330 and 340. The mold frame 300 includes a first receiving space R1 surrounded by the first, second, third and fourth sidewalls 310, 320, 330 and 340, and a plurality of receiving grooves 310a, 310b, 310c and 310d.

The first receiving space R1 is defined by the first to fourth sidewalls 310 to 340. The first sidewall 310 is partially recessed from a surface thereof to a predetermined depth, thereby forming the plurality of the receiving grooves 310a to 310d. The receiving grooves 310a to 310d are spaced apart from each other by a predetermined interval.

The first receiving space R1 receives the reflecting plate 240, the light guiding plate 220 and the plurality of the optical sheets 230 in that order. The receiving grooves 310a to 310d receive the first to fourth LEDs 211 to 214, respectively. When the first to fourth LEDs 211 to 214 are positioned within the first to fourth receiving grooves 310a to 310d, respectively, the second FPC 250 is disposed over the mold frame 300, and covers the receiving grooves 310a to 310d. The connection portion 251a of the second FPC 250 on which the first and second input terminals 254 and 255 are mounted is protruded toward the outside of the mold frame 300.

The bottom chassis 400 includes a bottom plate 410 and fifth, sixth, seventh and eighth sidewalls 420, 430, 440 and 450 that upwardly extended from the bottom plate 410, so that a second receiving space R2 is defined by the bottom plate 410 and the fifth, sixth, seventh and eighth sidewalls 420, 430, 440 and 450. The mold frame 300 is received in the second receiving space R2, and the mold frame 300 and the bottom chassis 400 are connected with each other. Accordingly, the first to fourth sidewalls 310 to 340 of the mold frame 300 face the fifth to eighth sidewalls 420 to 450 of the bottom chassis 400, respectively, after connecting the bottom chassis 400 with the mold frame 300.

When the bottom chassis 400 receives the mold frame 300, the bottom plate 410 of the bottom chassis 400 supports the reflecting plate 240 and the light guiding plate 220 received in the mold frame 300.

Figure 5:
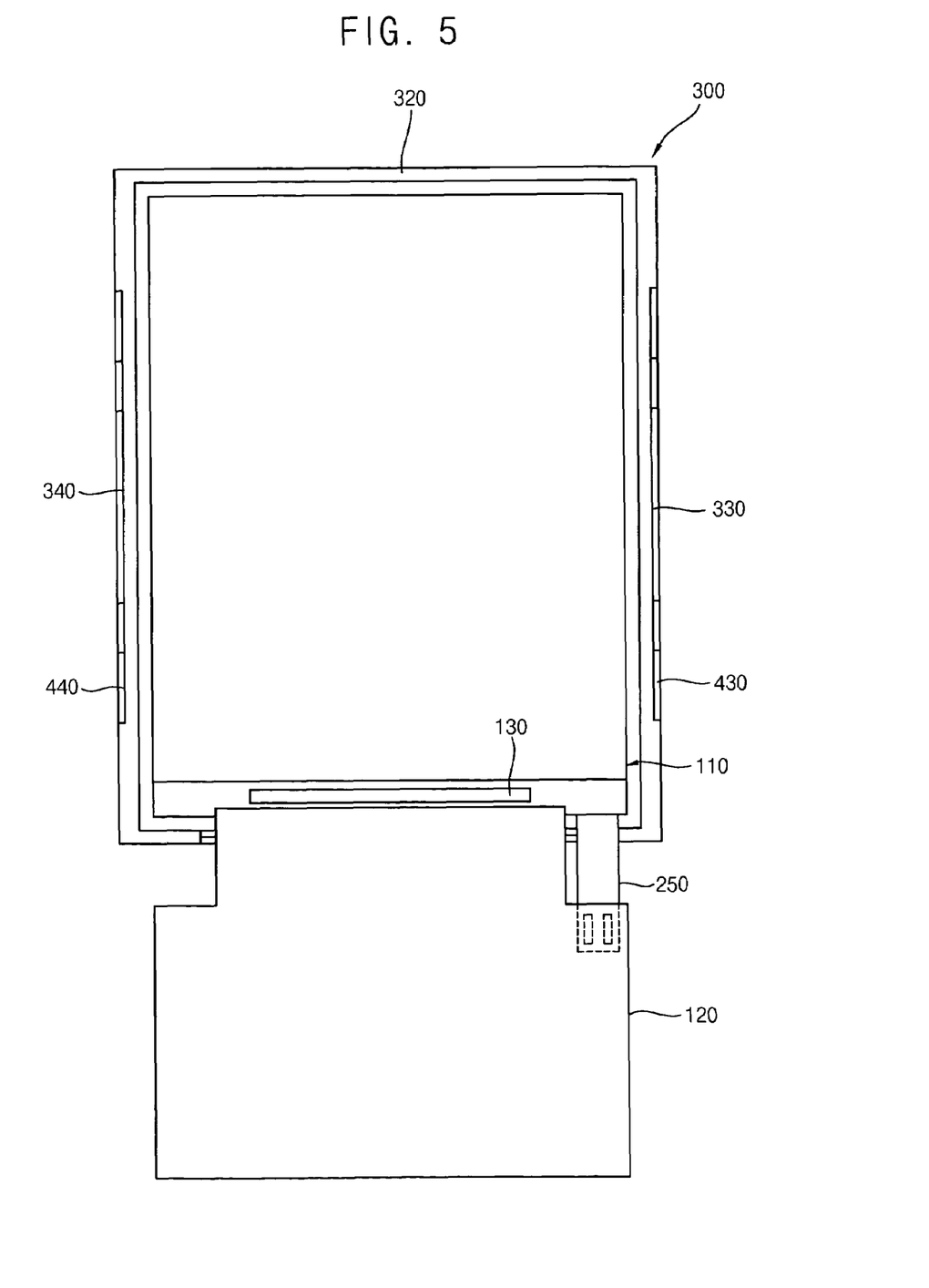
FIG. 5 is a plan view illustrating an assembled structure of a display unit and a receiving member.

FIG. 5 is plan view illustrating an assembled structure of a display unit and a receiving member in FIG. 1.

Referring to FIGS. 1, 2 and 5, first, second, third and fourth step portions 311, 321, 331 and 341 are formed on upper portions of the first to fourth sidewalls 310 to 340 of the mold frame 300, respectively, and thus a peripheral portion of the display unit 100 is disposed on the first, second, third and fourth step portions 311, 321, 331 and 341. In such a case, side faces of the display panel 110 of the display unit 100 are laterally supported by the first to fourth sidewalls 310 to 340, so that the display unit 100 is prevented from being separated from the mold frame 300.

Further, the first FPC 120 is mounted on an end portion of the display panel 110 and protrudes from the outside of the mold frame 300, and is overlapped with the connection portion 251b of the second FPC 250. In the present exemplary embodiment, the first FPC 120 is larger in size than the second FPC 250, so that a portion of the first FPC 120 is overlapped with the second FPC 250.

The first and second output terminals 121 and 122 of the first FPC 120 are electrically connected to the first and second input terminals 254 and 255 of the second FPC 250, respectively, in the overlapped portion of the first and second FPCs 120 and 250.

Figure 6:
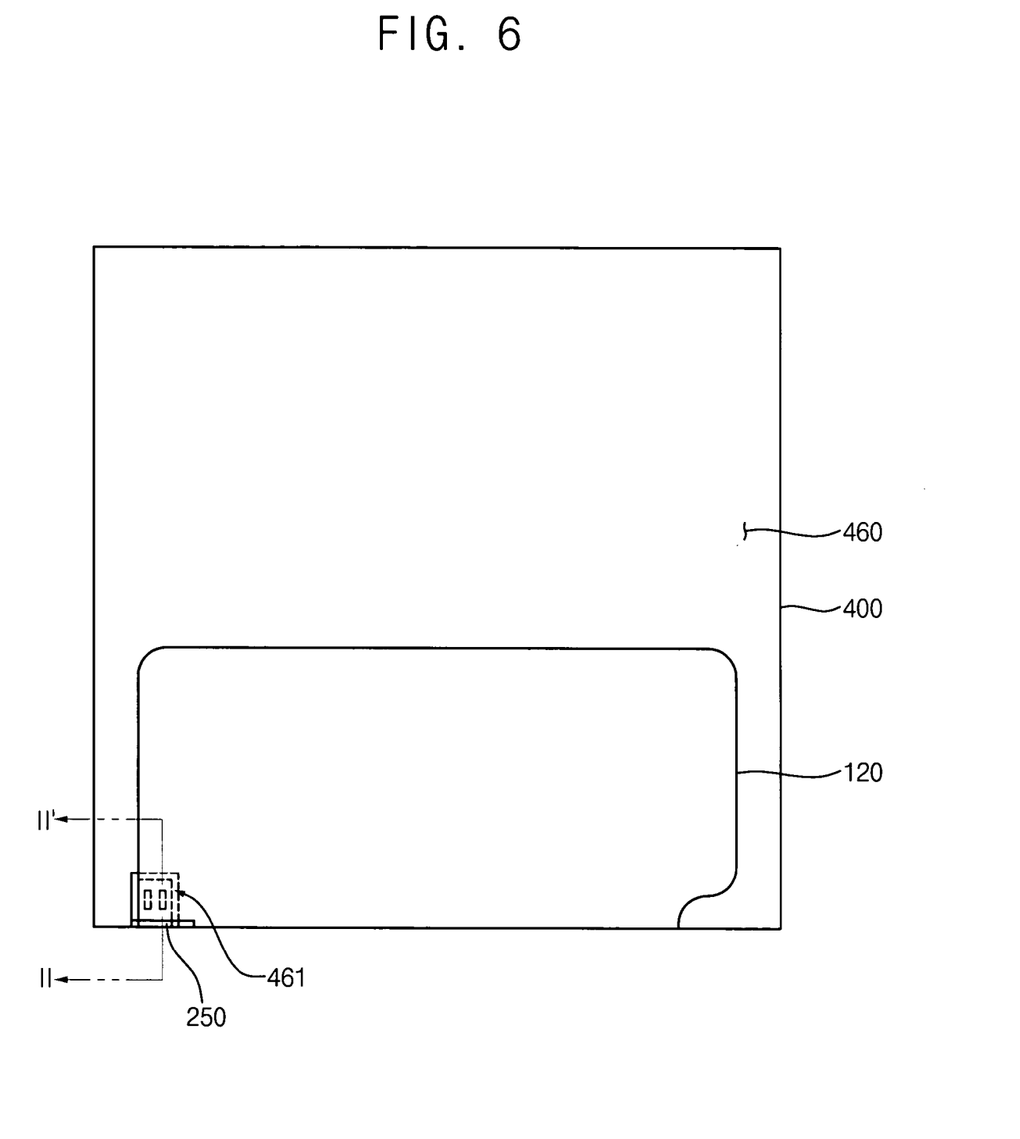
FIG. 6 is a rear view illustrating a LCD apparatus in FIG. 1.
Figure 7:
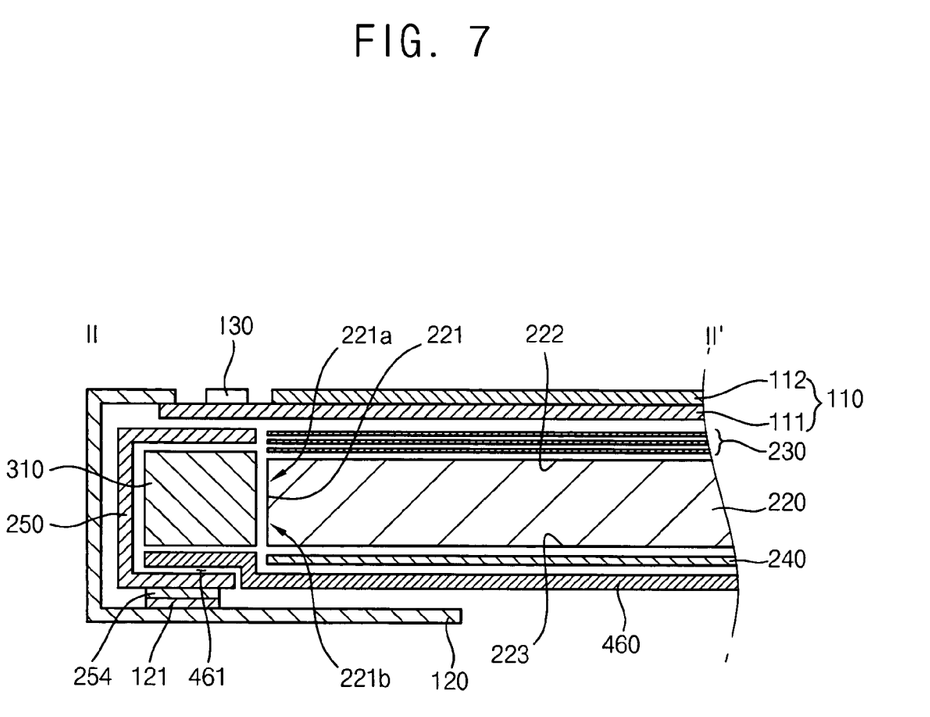
FIG. 7 is a cross-sectional view taken along a line II-II' in FIG. 6.

FIG. 6 is rear view illustrating a liquid crystal display apparatus in FIG. 1. FIG. 7 is a cross-sectional view taken along a line I-I' in FIG. 6.

Referring to FIGS. 6 and 7, the first FPC 120 is bent downwardly, and is disposed on a rear surface 460 of the bottom chassis 400, so that a top surface of the first sidewall 310 of the mold frame 300 and the fifth sidewall 420 of the bottom chassis 400 are surrounded by the first FPC 120.

In similar fashion, the second FPC 250 is bent, and disposed on the rear surface 460 of the bottom chassis 400, so that the top surface of the first sidewall 310 of the mold frame 300 and the fifth sidewall 420 of the bottom chassis 400 are also surrounded by the second FPC 250.

A second recessed portion 461 is formed on the rear surface 460 of the bottom chassis 400 to a predetermined depth from the rear surface of the bottom chassis 400, and receives the second FPC 250 after bending the FPC 250. Then, the first FPC 120 positioned on the rear face 460 of the bottom chassis 400 after bending is electrically connected to the second FPC 250 at the second recessed portion 461. Accordingly, the first output terminal 121 of the first FPC 120 is electrically connected to the first input terminal 254 of the second FPC 250 at the second recessed portion 461, as shown in FIG. 7.

"In the present exemplary embodiment, the depth of the second recessed portion 461 is substantially identical to a thickness of the second FPC 250, so that no step difference or at the very least substantially no step difference is formed between the second FPC 250 and the rear face 460 of the bottom chassis 400 after completing the bending of the first and second FPCs 120 and 250. In addition, when the first FPC 120 is disposed on the rear surface 460 of the bottom chassis 400 and is partially overlapped with second EPO 250 at the second recessed portion 461, no step difference or at the very least substantially no step difference is formed between an overlapping portion and a non-overlapping portion of the first and second FPCs 120 and 250."

Thus, the overall thickness of the backlight assembly does not increase or at the very least does not appreciably increase due to the overlap of the first and second FPCs 120 and 250 on the rear surface 460 of the bottom chassis 400.

Moreover, by there being no step difference or at the very least substantially no step difference between the overlapped portion and the non-overlapped portion of the first and second FPCs 120 and 250, this also removes the mounting restrictions for additional members typically caused by non-uniformity of the rear surface 460 when the additional members are mounted on the rear surface 460 of the bottom chassis 400. Therefore, assembling failures caused by non-uniformity or step difference of the rear surface 460 are sufficiently prevented. Examples of additional members include but are not limited to a printed circuit board or an auxiliary display panel for a dual paneled LCD.

According to the backlight assembly and the LCD apparatus including the backlight assembly of the present exemplary embodiment, the second recessed portion 461 is formed on the rear surface 460 of the bottom chassis 400 and the second FPC 250 for driving the first to fourth LEDs 211 to 214 is received in the second recessed portion 461, so that no step difference or at the very least substantially no step difference is formed between the second FPC 250 and the rear surface 460 of the bottom chassis 400. As a result, even though the second FPC 250 is disposed on the rear surface 460 of the bottom chassis 400, the overall thickness of the backlight assembly does not increase or at the very least does not appreciably increase. In addition, when the first FPC 120 is overlapped with the second FPC 250 on the rear surface 460 of the bottom chassis 400, no step difference or at the very least substantially no step difference is formed between an overlapping portion and a non-overlapping portion of the first and second FPCs 120 and 250, thereby improving assembly environment of the display apparatus.

Having described the exemplary embodiments of the present invention, it is further noted that it is readily apparent to those of reasonable skill in the art that various modifications can be made without departing from the spirit and scope of the present invention which is defined by the metes and bounds of the appended claims.

What is claimed is:

1. A backlight assembly comprising:
a light generating unit comprising:
  a connecting member receiving an external driving signal;
a light source disposed on the connecting member, the light source receiving the driving signal through the connecting member to generate a light; and
a light guiding member receiving the light from the light source to guide the light in a predetermined direction; and
a receiving member comprising: a first receiving container having a plurality of first sidewalls forming a frame and a receiving space defined by the first sidewalls in which the light source and the light guiding member are received, wherein the first receiving container includes at least one receiving groove recessed from one of the first sidewalls to a predetermined depth, and the light source is received within the receiving groove; and
a second receiving container connected to the first receiving container, the second receiving container having a receiving portion in which the connecting member is received, and the receiving portion comprising a recessed portion recessed from a rear surface of the second receiving container to a predetermined depth for receiving the connecting member, wherein the depth of the recessed portion recessed from the rear surface of the second receiving container is substantially identical to a thickness of the connecting member, and wherein the connecting member comprising a first flexible printed circuit board and a second flexible printed circuit board which are each bent downwardly and overlap at the recessed portion.

2. The backlight assembly of claim 1, wherein the second receiving container comprises a bottom plate and a plurality of second sidewalls extended from the bottom plate and the recessed portion is recessed from a rear surface of the second receiving container to a depth substantially identical to a thickness of the connecting member.

3. The backlight assembly of claim 1, wherein the light source comprises a light emitting diode.

4. The backlight assembly of claim 1, wherein the light guiding member comprises: a light incident face disposed adjacent to the light source, the light entering into the light incident face;
a light-exiting face extended from a first end portion of the light incident face, the light supplied thereto by the light incident face exits through the light-exiting face; and
a specular face extended from a second end portion of the light incident face, the specular face facing the light-exiting face, the specular face reflecting the light supplied thereto by the light incident face toward the light-exiting face.

5. The backlight assembly of claim 4, wherein the light-generating unit further comprises:
an optical sheet disposed over the light-exiting face, the optical sheet enhances optical characteristics of the light exiting the light-exiting face; and
a reflecting plate disposed under the specular face, the reflecting plate reflects a leakage light leaking from the specular face toward the light guiding member.

6. The backlight assembly of claim 1, wherein the connecting member is bent downwardly and disposed on a top rear surface of the first receiving member and a bottom of the second receiving member are surrounded by the connecting member.

7. A display apparatus comprising:
a display unit comprising:
- a display panel displaying an image in response to a first driving signal and a first connecting member electrically connected to the display panel;
- a light generating unit comprising:
- a second connecting member electrically connected to the first connecting member, the second connecting member receiving an external second driving signal;
- a light source disposed on the second connecting member, the light source receiving the second driving signal through the second connecting member;
- a light guiding member receiving light from the light source to guide the light toward the display panel; and
- a receiving member comprising: a first receiving container having a plurality of first sidewalls forming a frame and a receiving space defined by the first sidewalls in which the light source, the light guiding member and the display unit are received, wherein the first receiving container includes at least one receiving groove recessed from one of the first sidewalls to a predetermined depth, and the light source is received within the receiving groove; and
  - a second receiving container connected to the first receiving container and the second receiving container having a receiving portion in which the second connecting member is received, and the receiving portion comprising a recessed portion recessed from a rear surface of the second container to a predetermined depth for receiving the second connecting member, the second connecting member is partially overlapped with the first connecting member on the rear surface of the second receiving container, wherein the depth of the recessed portion recessed from the rear surface of the second receiving container is substantially identical to a thickness of the second connecting member.

8. The display apparatus of claim 7, wherein the second connecting member is smaller in size than the first connecting member.

9. The display apparatus of claim 8, wherein the light source comprises a plurality of light emitting diodes (LEDs).

10. The display apparatus of claim 9, wherein said plurality of LED's comprises four LEDs.

11. The display apparatus of claim 10, wherein a portion of the first and second connecting members are each bent downwardly with respect to the first and second containers.

12. The display apparatus of claim 11, wherein the first connecting member comprises an output terminal outputting the external second driving signal provided thereto, and the second connecting member comprises an input terminal electrically connected to the output terminal to receive the second driving signal from the output terminal.

13. The display apparatus of claim 12, wherein the input and output terminals are electrically connected to each other at the receiving portion of the second receiving container.

14. The display apparatus of claim 7, wherein the first and second connecting members comprise a flexible film.

15. The display apparatus of claim 7, further comprising a driver generating the first driving signal in response to an external signal.

16. The display apparatus of claim 15, wherein the driver is disposed on the display panel as a chip.

17. The display apparatus of claim 16, wherein the first connecting member is electrically connected to the display panel, so that the external signal is supplied to the driver through the first connecting member.

18. The display apparatus of claim 7, wherein the first connecting member is bent downwardly and disposed on a top surface of the first receiving member and a bottom of the second receiving member are surrounded by the first connecting member.

19. A display apparatus comprising:
a display unit comprising:
- a display panel displaying an image in response to a first driving signal and a first flexible printed circuit board (first FPC) electrically connected to the display panel;
- a light generating unit comprising:
- a second flexible printed circuit board (second FPC) electrically connected to the first FPC, the second FPC receiving an external second driving signal;
- a plurality of light emitting diodes (LEDs) disposed on the second connecting member, the plurality of LEDs receiving the second driving signal through the second FPC;
- a light guiding member receiving light from the light source to guide the light toward the display panel; and
- a receiving member comprising a frame and bottom chassis, the frame comprises first, second, third and fourth sidewalls and a first receiving space surrounded by the first, second, third and fourth sidewall and a plurality of receiving grooves, the first receiving space is defined by the first, second, third and fourth sidewalls, the first sidewall is partially recessed from a surface thereof to a predetermined depth, thereby forming the plurality of receiving grooves, the first receiving space receives the light guiding member and the plurality of receiving grooves receives the plurality of LEDs therein, the bottom chassis comprises a bottom plate and fifth, sixth, seventh and eight sidewalls that upwardly extend from the bottom plate to define a second receiving space, the frame and the bottom chassis are connected to one another, such that the frame is received in the second receiving space of the bottom chassis,
the first FPC is bent downwardly and disposed on the rear surface of the chassis such that a top surface of the first sidewall of the frame and the fifth sidewall of the bottom chassis are surrounded by the first FPC, the second FPC is bent and disposed on the rear surface of the bottom chassis , such that the top surface of the first sidewall of the frame and the fifth sidewall of the bottom chassis are surrounded by the second FPC, the first FPC is larger in size than the second FPC such that the first FPC is partially overlapped with the second FPC, the bottom chassis further comprises a recessed portion recessed from the rear surface of the bottom chassis to a predetermined depth for receiving the second FPC, the depth of the recessed portion is substantially identical to a thickness of the second FPC.

* * * * *